United States Patent [19]

Miller

[11] 4,439,463

[45] Mar. 27, 1984

[54] PLASMA ASSISTED DEPOSITION SYSTEM

[75] Inventor: Stephen C. Miller, Simi Valley, Calif.

[73] Assignee: Atlantic Richfield Company, Los Angeles, Calif.

[21] Appl. No.: 349,892

[22] Filed: Feb. 18, 1982

[51] Int. Cl.³ .............................................. C23C 11/00
[52] U.S. Cl. ...................................... 427/39; 427/41; 427/86; 427/87
[58] Field of Search ....................... 427/39, 41, 86, 87

[56] References Cited

U.S. PATENT DOCUMENTS 3,961,103  6/1976  Aisenberg ............................ 427/39

Primary Examiner—James R. Hoffman
Attorney, Agent, or Firm—Nilsson, Robbins, Dalgarn, Berliner, Carson & Wurst

[57] ABSTRACT

Process for use in the deposition of a semiconductor film involves: producing a stream of reactive gaseous species within a first chamber, the reactive species containing a substance to be included within the film; passing the reactive species to a work environment distinct from the first chamber; and incorporating the substance from the reactive species into a film deposited within the work environment.

2 Claims, 6 Drawing Figures

PLASMA ASSISTED DEPOSITION SYSTEM

BACKGROUND

This invention relates generally to a system for producing and utilizing a stream of reactive gas species and, more particularly, to a plasma-assisted deposition system.

In many circumstances it is desirable to enhance the composition and quality of deposited semiconductor films. Plasmas or glow discharges have been used in conjunction with the deposition of semiconductor films for these purposes. For example, deposition has been carried out in the presence of a glow discharge containing one or more elements of the deposited film. The discharge is generated within the deposition environment, constraining the pressure and temperature therein to levels which can support the glow. Two recent systems of this type are described in Habermeier, *Thin Solid Films,* 80 (1981) 157–160, and Avaritsiotis et al., *Thin Solid Films,* 77 (1981) 351–357. Although these publications are dated after the conception date of the present invention, and are therefore not prior art to it, the underlying concept of generating a plasma or glow discharge within a deposition environment is prior art. The Habermeier and Avaritsiotis, et al. articles describe this concept as it relates to the deposition of particular transparent conducting films.

Another application of plasma technology to a deposition process involves the use of a plasma torch to spray polycrystalline semiconductor films onto substrates, as disclosed in Janowiecki et al. U.S. Pat. No. 4,003,770. In the Janowiecki et al. disclosure, a plasma is generated in a pressurized stream of "plasma forming gas" to produce a downwardly directed plasma jet. A semiconductor material such as silicon is fed into the plasma stream in the form of granules and is carried thereby to a substrate for deposition. The granules are melted by the plasma torch and sprayed by the torch onto the substrate. Silicon carried by the plasma stream exists as a number of discrete masses of silicon, in either the solid or liquid phase, until formed into a continuous film on the substrate.

Plasmas have also been used for the purpose of etching semiconductor materials, as described in Horiike, et al., "Proceedings of the 7th Conference on Solid State Devices," Tokyo, 1975, Supplement to *Japanese Journal of Applied Physics,* Volume 15 (1976). Horiike, et al. uses a plasma created by an electrical discharge in a $CF_4$—$O_2$ mixture to etch films of various solid state materials, working primarily with a plasma produced in a main etching chamber. However, an experimental apparatus is also described in which a plasma produced within a first chamber is passed to a separate chamber for etching. This is done to investigate the dependence of etch rate on gas pressure. The teachings of Horiike, et al., are specific to the purposes of etching.

Therefore, it is desirable to provide an effective and versatile system for enhancing the composition and quality of deposited semiconductor films.

SUMMARY OF THE INVENTION

The process and apparatus of the present invention involve: producing a stream of reactive gaseous species within a first chamber, the reactive species containing a specified substance; passing the reactive species to a work environment distinct from the first chamber; and incorporating the substance from the reactive species into a film deposited within the work environment. According to a preferred embodiment of the present invention, the stream of reactive gaseous species is produced by exposing a flow of gaseous material to an electrical discharge. The electrical discharge may generate a glow discharge within the material, ionizing and possibly dissociating it.

The gaseous species produced in the practice of the present invention are ideal for use in a deposition process due to their high reactivities. In most cases a number of reactive ionic species or highly reactive radicals are produced by the electrical discharge. Some of the species survive long enough to reach the deposition environment, while others recombine to form uncharged stable molecules. Recombination can result from collision of the reactive species with the walls of the vessels in which they are confined, with each other, or with stray electrons. Although the structures and lifetimes of many of the species produced by the present invention have not been experimentally determined, applicant has confirmed that a substantial number of reactive molecules survive transportation to the work environment and become incorporated into the semiconductor film deposited therein.

In the deposition of indium tin oxide (ITO) films, applicant has subjected oxygen gas to an electrical discharge within the first chamber of the present invention and introduced the resulting highly reactive species to an evaporative deposition environment containing indium and tin. The deposited ITO films have exhibited significantly higher optical transmittances and electrical conductivities than films produced in the same apparatus without an electrical discharge. Similarly, fluorine atoms can be incorporated into deposited films by passing a fluorocarbon gas through the electrical discharge apparatus and conducting the resultant reactive species to a deposition environment. Despite the difficulty encountered by others in depositing films containing fluorine, the films described above show significant fluorine levels.

In the present invention, reactive gaseous species are generated within a chamber distinct from the work environment. The work environment is thus not constrained by the conditions required to sustain a glow discharge, permitting flexibility as to the deposition process conducted therein. For instance, the work environment may be a high vacuum chamber for evaporation of one or more constituent elements of the film using an electron beam gun. In the prior deposition systems known to applicant, any glow discharge is generated within the work environment itself. The pressure within the work environment must then be great enough to sustain a glow. However, pressures of this magnitude are too great for use of an electron beam gun to evaporate deposition materials because the gas species will then react with and possibly burn out the emitter of the electron gun.

Independence of the work environment from the area of electrical discharge also enables the work environment to be maintained near atmospheric pressure, provided the reactive species have sufficiently long lifetimes at that pressure. The deposition can thus be performed as part of an in-line process. For example, the substance contained within the reactive species may be a semiconductor compound such as silicon for introduction into an in-line chemical vapor deposition (CVD) system which is essentially open to the atmosphere.

The present invention permits depositions to be accomplished at significantly lower temperatures than would otherwise be required, due to the highly reactive state of the species produced by electrical discharge. The species tend to react more fully, even at the lower temperatures, to produce a film having a desired atomic structure.

BRIEF DESCRIPTION OF THE DRAWINGS

The above and other objects of the present invention may be more fully understood from the following detailed description, taken together with the accompanying drawings, wherein similar reference characters refer to similar elements throughout and in which.

DESCRIPTION OF THE PREFERRED EMBODIMENTS

The process and apparatus of the present invention relate generally to deposition of a semiconductor film 10 onto a substrate 12. The film 10 may be made of virtually any semiconductor material, while the substrate 12 may be either a single homogeneous layer of a different material or a composite structure made up of a number of individual layers. For example, the layer 12 may be a solar cell or other semiconductor device made of either crystalline or amorphous materials.

Figure 3:
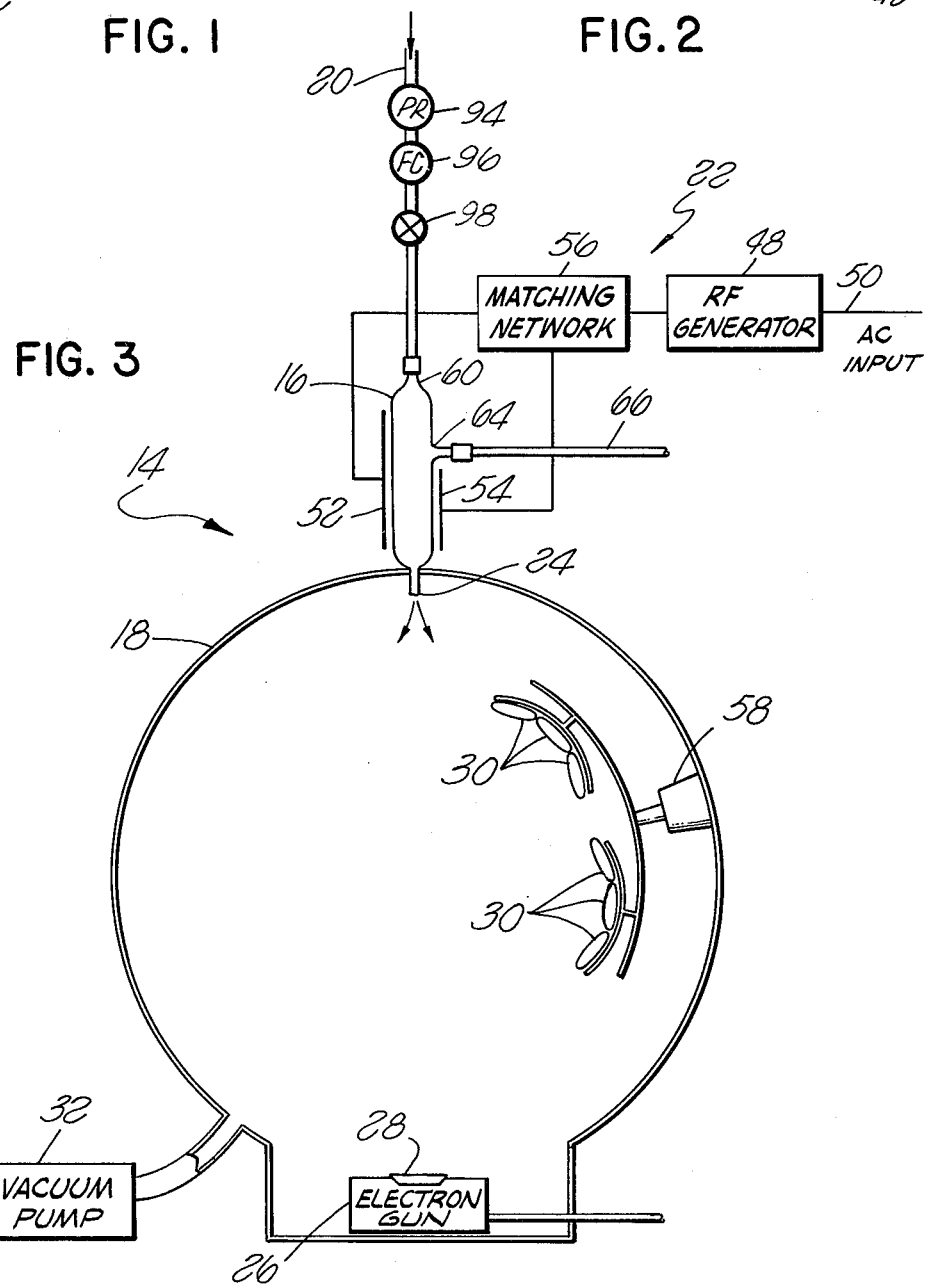
FIG. 3 is a somewhat schematic view of a deposition apparatus constructed according to one embodiment of the present invention.

The semiconductor film 10 may be deposited according to the present invention using an apparatus 14 which is shown in FIG. 3. The apparatus 14 includes a first flow-through chamber 16 and a work chamber 18. A gas containing a substance to be incorporated into a deposited film is introduced at a controlled rate to the chamber 16 through an inlet line 20. As the gaseous substance passes through the chamber 16, it is subjected to an electrical discharge by a circuit 22 to produce an ionizing glow discharge therein. The work chamber 18 communicates with the first chamber 16 through an orifice 24 for introduction of the gaseous products of the glow discharge into the work chamber.

The work chamber 18 preferably contains an electron gun 26 having one or more pockets 28 of material to be included in a deposited film. Material is evaporated by the electron gun 26 as the products of electrical discharge are introduced to the work chamber through the orifice 24. The evaporated material and the products of electrical discharge are thus able to react within the chamber 18 for deposition onto a number of substrates 30 within the chamber. The reaction and deposition process is facilitated by the fact that the products of electrical discharge are in a highly reactive gaseous state upon entering the work chamber.

Because the electrical discharge producing the reactive species is accomplished within the first chamber 16 rather than the work chamber 18, the environment of the work chamber is not constrained by the conditions necessary to sustain the discharge. In the embodiment shown in FIG. 3, the work chamber 18 is a high vacuum chamber having a vacuum pump 32 suitable for lowering the pressure within the chamber to that at which the electron gun can operate. Possible damage to the electron gun is thus avoided and the level of contaminating material reaching the substrate 30 is greatly reduced. The low pressure within the work chamber 18 acts to draw the products of electrical discharge through the orifice 24 at a controlled rate, into the clean evaporated environment of the work chamber.

Figures 1, 2:
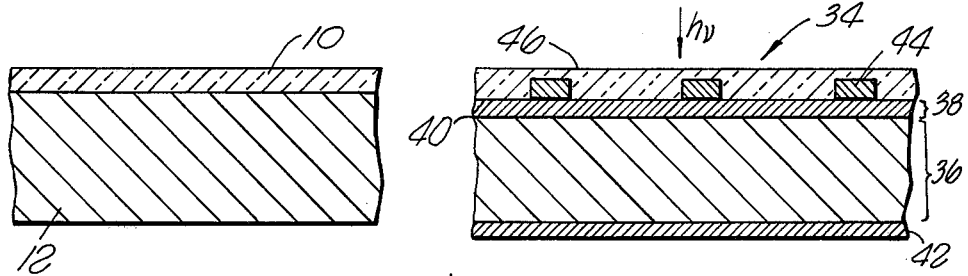
FIG. 1 is an enlarged fragmentary vertical sectional view of a layer of semiconductor material deposited on a substrate according to the present invention.
FIG. 2 is an enlarged fragmentary vertical sectional view showing a shallow junction solar cell having an upper transparent conductive layer applied according to the present invention.

While the structure of FIG. 1 illustrates generally a semiconductor film deposited in accordance with the present invention, a particular example of a structure incorporating such a film is shown in FIG. 2. FIG. 2 illustrates a shallow junction solar cell 34 formed from a pair of semiconductor layers 36 and 38 defining a junction 40 therebetween. The cell 34 is provided with a lower metallic contact layer 42 forming an ohmic contact with the layer 36, and an upper metallic contact grid 44 applied to the layer 38. A transparent conducting layer 46 is applied over the contact grid 44 and the layer 38 to lower the series resistance of the cell.

Although semiconductor layers 36 and 38 are shown as discrete layers in FIG. 2, it will be understood that the layer 38 is commonly an "n+-type" layer formed by diffusion of an n-type dopant into a p-type substrate 36. In the case of a p-type silicon substrate, the n-type dopant may be phosphorous. Alternatively, the solar cell 34 may be a thin film cell, such as an amorphous cell for which the layer 46 is a transparent conducting electrode.

The solar cell 34, although conventional in its basic arrangement of elements, is novel in that the transparent conducting layer 46 is applied according to the teachings of the present invention. The layer 46 may be made of any transparent conducting material, such as indium tin oxide (ITO), tin oxide (TO), indium oxide (IO) or cadmium tin oxide (CTO), deposited with the apparatus of FIG. 3. Any of these materials may also be doped with fluorine using the apparatus 14 as discussed below. In the case in which the layer 46 is an ITO film, oxygen gas may be dissociated into its more reactive species by the first chamber 16, with indium and tin being evaporated by the source 26 of the work chamber. If desired, a suitable fluorocarbon gas may then be passed through the first chamber 16 with the oxygen for dissociation and incorporation into the film. In the alternative, a fluorocarbon gas may be passed through the chamber 16 alone, with indium oxide and tin oxide being evaporated by the source 26.

Transformation of the oxygen component of the film into its more reactive species enhances the extent of reaction between the oxygen, indium and tin, producing a more transparent and more highly conductive film than is achieved without an electrical discharge. In fact, the quality of unannealed films produced according to the present invention have been as high as that of any ITO films known to applicant, either annealed or unannealed.

The quality of the transparent conducting layer 46 has a significant effect on the maximum power achieveable with the cell 34. This is so because shallow junctions, while desirable to improve the spectral response of solar cells by permitting even the violet and blue portions of solar radiation to penetrate to the junction depth, are plagued with high sheet resistivities and high surface recombination velocities, causing many of the generated charge carriers to degrade before reaching the contact grid 44. The degradation of carrier flow is manifested as a contribution to the overall series resistance of the cell, reducing the maximum useful power produced. The transparent conductive layer 46, however, combines with the upper semiconductor layer 38 to give an effective overall sheet resistance, $R_{\Box T}$, which is less than the sheet resistance of either layer individually. The sheet resistances combine in a manner similar to that of absolute resistances connected in parallel, yielding an effective overall sheet resistance given by the expression $$R_{\Box T} = \frac{(R_{\Box A})(R_{\Box B})}{R_{\Box A} + R_{\Box B}},$$

where $R_{\Box A}$ and $R_{\Box B}$ are the individual sheet resistances of the layers 46 and 38, respectively. The layer 46 also helps to passivate the surface of the upper layer, lowering the troublesome surface recombination velocity.

In the context of the crystalline solar cell 34, the substrate forming the layers 36 and 38 may be any thickness greater than or equal to approximately 1 or 2 mils. Typically, the substrate will be between 2 and 10 mils thick. The diffused junction 40 can then be on the order of 0.3 microns deep to insure good spectral response of the cell. It is at this point that the series resistance effects of the shallow layer become great enough to significantly degrade the maximum power point, and thus the fill factor, of the cell for many common grid configurations. The contact grid 44 of the cell may be composed of lines 1 mil wide and 1 mil high, with a center-to-center spacing of greater than 1 mm.

Referring again to FIG. 3, it can be seen that the discharge circuit 22 comprises an RF generator 48 connected to an AC input line 50 to apply a voltage to electrodes 52 and 54 through a matching network 56. The electrodes 52 and 54 may comprise foil strips positioned about the exterior of the first chamber 16, for producing an RF discharge through the contents of the chamber. The electrodes are parallel to the direction of gas flow within the chamber 16 and may extend different distances upwardly therealong. In the preferred embodiment of the present invention, the generator 48 produces an RF signal having a frequency of 13.56 megahertz. However, it will be understood that the electrical discharge of the present invention may have virtually any frequency, or may be a DC discharge. The chief difference encountered by significantly reducing the frequency of the discharge is an increase in spatial variation of the ionization and glow produced within the chamber 16.

The substrates 30 are preferably mounted to a conventional planetary substrate holder 58 to increase the uniformity of the films deposited thereon. The various portions of each substrate are therefore exposed to approximately the same deposition conditions, producing films of uniform quality and thickness.

Figure 4:
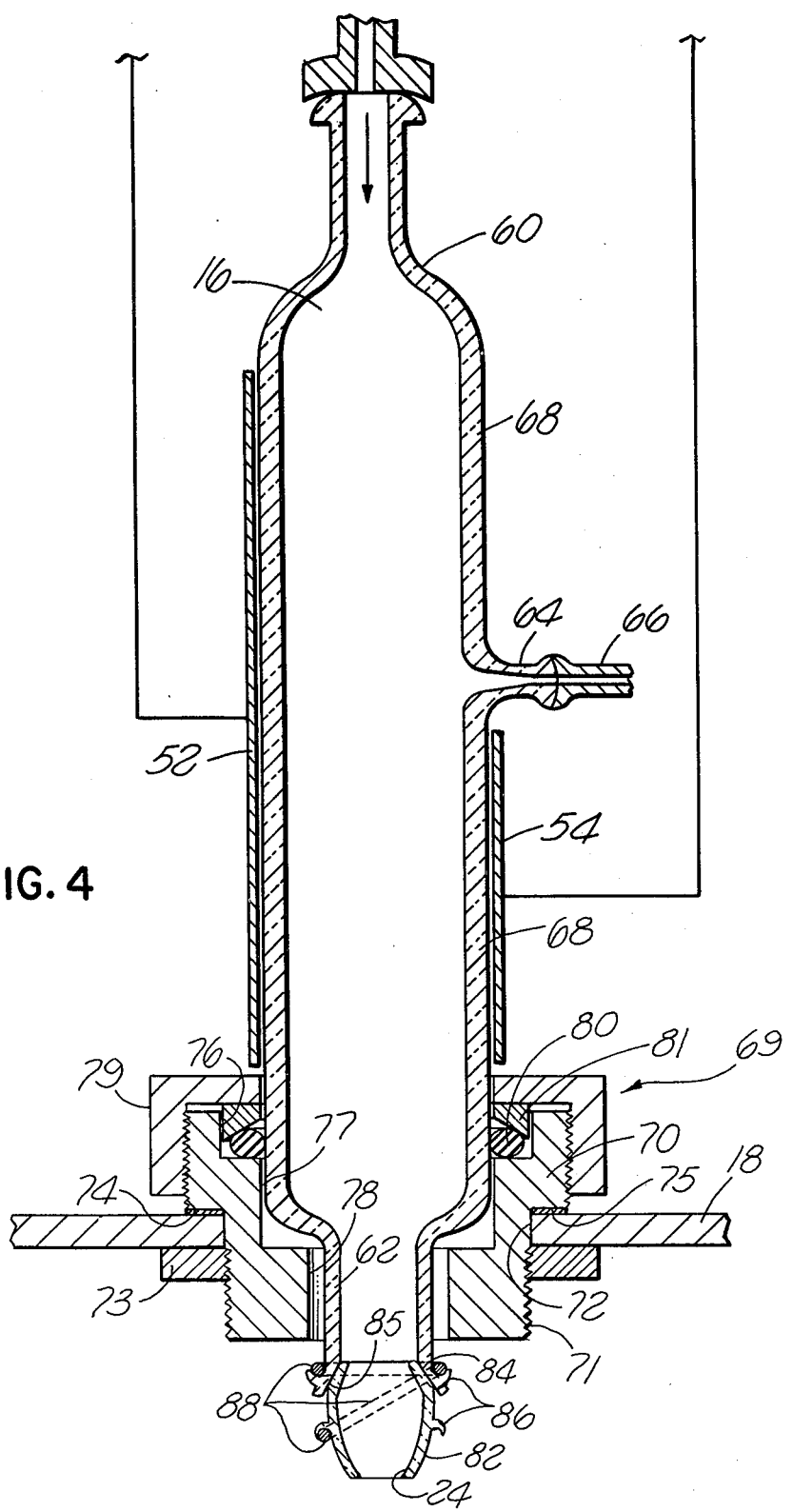
FIG. 4 is an enlarged sectional view showing the apparatus of FIG. 3 adjacent to the first chamber thereof.

Referring now to FIG. 4, the first chamber 16 is shown in somewhat greater detail therein. The first chamber 16 extends from an upper inlet 60 to a lower outlet stem 62, and has a side port 64. The side port 64 is connected through a line 66 to a thermocouple (not shown) for monitoring the pressure within the first chamber. Between the inlet 60 and the outlet 62, the first chamber 16 is provided with an enlarged elongated wall section 68 about which the electrodes 52 and 54 are located.

The outlet stem 62 and the lower end of the wall section 68 are joined to the wall of the work chamber 18 by a compression coupling arrangement 69. The coupling arrangement 69 includes an annular body 70 having a threaded portion 71 which extends downwardly through an opening 72 of the work chamber. A nut 73 is threaded onto the portion 71 within the chamber to draw a shoulder 74 of the annular body downwardly against the exterior wall of the work chamber. A ring 75 of suitable sealing material is confined between the shoulder 74 and the wall of the work chamber to form an airtight seal.

The interior of the annular element 70 comprises a series of bores 76, 77 and 78 of successively smaller diameters, for reception of the lower end of the first chamber. When the first chamber is positioned within the annular body 70, the lower end of the wall portion 68 is closely received by the bore 77 and the outlet stem 62 extends through the bore 78. The first chamber is held within the annular element and sealed relative thereto by a collar 79 threaded over the upper end of the annular element to force an o-ring 80 against the wall section 68. Compression of the o-ring 80 is facilitated by a ring 81 of wedge shaped cross-section between the o-ring and the collar.

The orifice 24 is provided at the lower end of a glass tip element 82 having an upper tapered ground glass surface 84 for reception within a tapered ground glass fitting 85 at the lower end of the stem 62. The tip element 82 and the stem 62 are also preferably provided with a plurality of oppositely directed hook-like projections 86 which are engageable by a spring element 88 to hold the tip 82 in place. When it is desired to change the size or configuration of the orifice 24, the spring element 88 is released from the projections 86. The glass tip 82 can then be removed and exchanged for a tip having a different orifice. Upon reassembly, the spring element 88 again holds the ground glass surface 84 of the glass tip 82 in engagement with the glass surface 85.

The rate of fluid flow from the orifice 24 depends on both the size of the orifice and the pressure gradient between the flow-through chamber 16 and the work chamber 18. The pressure within the chamber 16, and thus the pressure gradient between the chamber 16 and the work chamber, depend in part on the ratio of orifice size to the diameter of the flow-through chamber. However, the diameter of the chamber 16 is held constant in the apparatus 14, with the size of the orifice being variable to adapt the apparatus to different sets of process conditions. Typical orifice sizes for a chamber 16 approximately 3 centimeters in diameter would fall within the range of 1 millimeter to 15 millimeters in diameter, and would preferably be approximately 15 millimeters.

As shown in FIG. 3, the gas inlet line 20 is connected to the upper inlet 60 of the first chamber through a pressure regulator 94, a mass flow controller 96 and a solenoid valve 98. The regulator 94 maintains a preselected gas pressure to the inlet 60, while the flow controller 96 indicates and adjusts the rate of gas flow through the chamber 16. The flow valve 96 may be a simple "on-off" valve.

Figure 6:
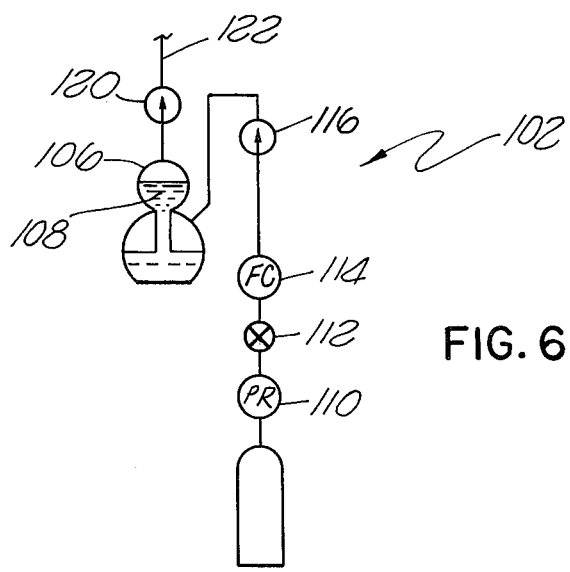
FIG. 6 is an apparatus for vaporizing a solution at low temperatures for use in the apparatuses of FIGS. 3 and 5.

While in some circumstances the material treated within the first chamber 16 will be in a naturally gaseous state at the temperatures and pressures encountered in the apparatus 14, it is often desirable to work with substances which are not normally gases. The vaporizing system 102 of FIG. 6 may then be used to produce a vapor stream containing the substance. Vaporizing systems of this type have been used in prior CVD apparatuses and will be described only briefly herein. A carrier gas such as argon is supplied from a pressurized source 104 to a bubbler arrangement 106 for passing the gas upwardly through a liquid 108 containing the substance. The pressure and flow of gas from the source 104 are carefully controlled by a pressure regulator 110, a flow valve 112, a mass flow controller 114 and a one-way check valve 116. As the gas bubbles upwardly through the liquid 108, it becomes saturated with liquid and carries molecules thereof outwardly through a second check valve 120 and an output line 122. The output line 122 leads to the inlet line 20 of the apparatus 14 to conduct the saturated carrier gas to the first chamber 16. Within the first chamber the molecules of the liquid 108 are ionized in the manner described above, yielding highly reactive gaseous species for use in the deposition process.

Operation of the apparatus 14 is commenced by loading a plurality of the substrates 30 onto the substrate holder 58 and placing the necessary source material within the pockets of the evaporative source 26. The second chamber 18 is then evacuated with the pump 32 to a desired level of vacuum, and the valve 98 is opened to permit gaseous material to pass into the first chamber 16 at a controlled rate. The rate of gas discharge from the chamber 16 is controlled by the stem 62 having a glass tip with an appropriately sized orifice 24. When the pressure of the gaseous material in the first chamber reaches a desired steady state value, as indicated by a thermocouple (not shown) connected to the side port 64 of the first chamber, the RF generator 48 is activated to produce an electrical discharge through the electrodes 52 and 54. The gas pressure and level of electrical discharge will preferably be chosen to produce a glow discharge within the chamber 16. The glow signifies a high degree of ionization within the chamber 16, the gaseous material being broken down or otherwise transformed into highly reactive gaseous species. The reactive species are either suitable for at least partial incorporation into the deposited film, or likely to react in transit to the deposition surface to produce species that are suitable.

The vacuum pump 32 operates to maintain the pressure within the work chamber 18 at a suitably low level, preferably no more than $9 \times 10^{-4}$ Torr, permitting the electron gun of the source 26 to function without damage. The level of contaminants within the deposited film is also kept at a minimum by continued evacuation, while the level of reactive gaseous species and other constituent elements of the film are maintained at suitably high levels for deposition. The result is a film in which the various constituent elements have reacted with each other in the intended manner to form a film having a desired molecular composition, as deposited. The quality of the film is much higher than that achieved with most other processes known to applicant, due primarily to the high reactivity of the gaseous material after electrical discharge.

Figure 5:
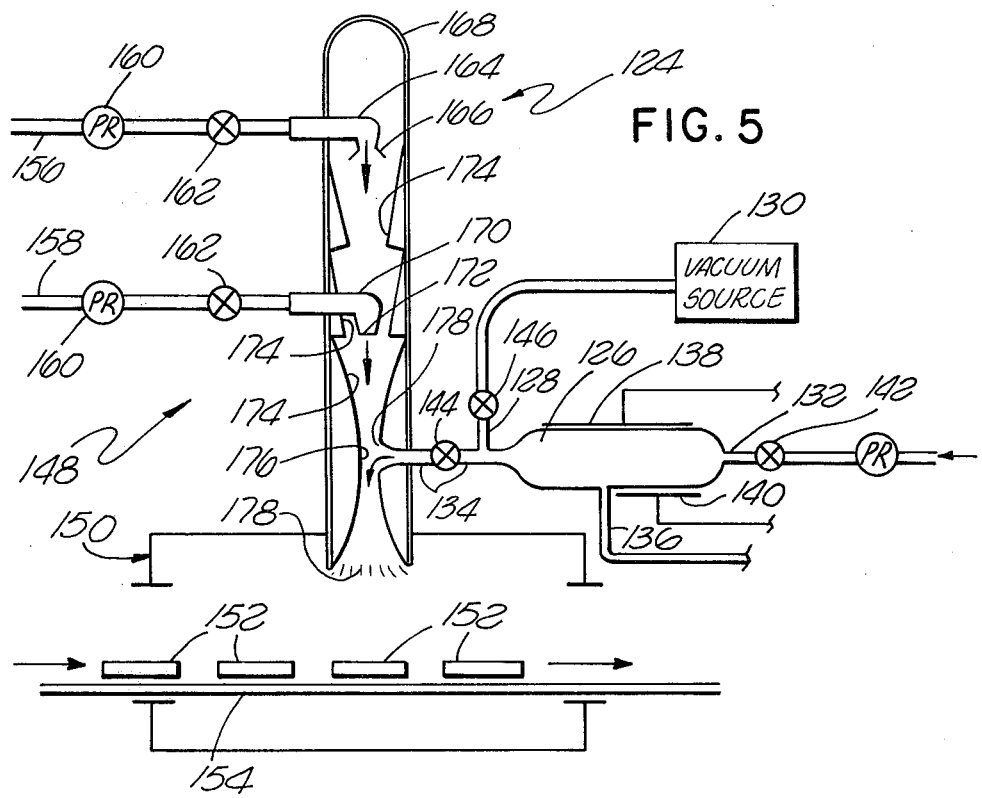
FIG. 5 is a schematic view of an apparatus constructed according to a second embodiment of the present invention.

Turning now to FIG. 5, there is illustrated a second embodiment of an apparatus for performing the process of the present invention, designated 124. The embodiment 124 comprises a first chamber 126 which is similar to the first chamber 16 of FIG. 3, except for the provision of a separate vacuum port 128 connectable to a vacuum source 130. Thus, the first chamber 126 is provided with an inlet 132, an outlet 134, a side thermocouple port 136, and a pair of electrodes 138 and 140. The electrodes 138 and 140 are connected to a discharge circuit (not shown) similar to the discharge circuit 22 of FIG. 3, and the ports 132, 134 and 128 are provided with flow valves 142, 144 and 146, respectively.

An aspirating arrangement 148 is provided for drawing reactive gaseous species from the outlet port 134 of the first chamber and carrying the reactive species to a flow-through work chamber 150. The interior of the work chamber 150 is preferably maintained at atmospheric pressure for passage of a plurality of substrate elements 152 therethrough on a conveyor arrangement 154.

The aspirating arrangement 148 comprises a pair of input lines 156 and 158 connected to a pressurized source of a suitable carrier gas (not shown), and the lines 156 and 158 are provided with corresponding pressure regulators 160 and flow valves 162. The line 156 terminates in a first nozzle 164 having a flared outlet 166 directed downwardly through a column 168. The line 158 is provided with a second nozzle 170 having a restricted outlet 172 directed downwardly through the column at a location spaced beneath the first nozzle 164. The nozzles 164 and 170 thus emit controlled downward flows of a suitable carrier gas through the column 168 when the valves 162 are open. The interior of the column 168 is provided with a plurality of tapered wall structures 174 establishing a venturi effect within the column. Most importantly, the interior of the column 168 is narrowed to a bore 176 at a location opposite the first chamber 126. The outlet port 134 of the first chamber communicates with the narrowed bore 176 at an opening 178. Beneath the bore 176, the interior of the column 168 again flares outwardly and empties into the work chamber 150 through a diffuser grate 180. The flow of gas downwardly through the column 168 is thus carefully controlled and accelerated to a maximum value at the narrowed bore 176. The flow of carrier gas across the opening 178 serves to create a partial vacuum within the outlet port 134 to draw reactive gas species from the first chamber 126. The reactive species are carried by the gas flow to the work chamber 150 for incorporation into a deposition film on the substrates 152.

Whereas the apparatus 14 of FIG. 3 incorporates a substantially closed deposition environment maintained at a lower pressure than the discharge environment of the first chamber, the apparatus 124 is useful with a deposition environment having a pressure which exceeds that of the first chamber. The apparatus 124 is particularly adapted to continuous in-line deposition processes of the type most desired in large scale production systems. Thus, the apparatus 124 can be used to continuously deposit films of silicon or other semiconductor materials in a low temperature chemical vapor deposition (CVD) process. For this purpose, silane or other suitable gaseous material can be introduced into the first chamber 126 for activation by the electrical discharge therein. Alternatively, a liquid containing the substance to be deposited can be vaporized in the system 102 of FIG. 6 for introduction into the first chamber 126 and eventual deposition of at least a portion thereof onto the substrate elements 152. A wide variety of materials, including organometallic materials such as tetramethyl tin and titanium isopropoxide, can be used with the vaporizing system 102 for deposition within the work chamber 150. When the material used for deposition is either combustible or medically hazardous, it is desirable to purge the area of the work chamber 150 with an inert gas and close the area off to some extent. The inert gas used for this purpose may comprise the carrier gas supplied through the input lines 156 and 158 for aspiration.

It will be understood that a suitable vacuum pump may be substituted for the aspirating arrangement 148 to provide the interface between the first chamber 126 and the work chamber 150. Such an interface is necessary because the pressure for sustaining a glow discharge within the first chamber 126 is substantially less than atmospheric pressure. Without the aspirating arrangement 148 or a suitable vacuum pump, gas from the work chamber 150 would back up into the first chamber. The chamber 126 would then become contaminated and the glow discharge would cease. However, when a vacuum pump is used as the interface mechanism, components of the pump contacted by the gas must be made of a material which will not react with it. Otherwise, the pump can be damaged or the system contaminated by deposition or etching within the pump.

Operation of the apparatus 124 is commenced by setting up a gas flow and an electrical discharge within the first chamber 126. For this purpose, the valves 142 and 146 are opened to produce a steady flow of the desired gaseous material through the first chamber. The pressure within the chamber can be monitored by a thermocouple (not shown) connected to the side port 136, and an electrical discharge through the gas can be commenced. The valves 162 can then be opened to cause a flow of carrier gas downwardly through the column 168, producing a low pressure condition across the opening 178. The pressure at the opening 178 and the dimensions of the opening and the outlet port 134 are chosen such that the vacuum effect achieved with the aspirating arrangement 148 is substantially equal to that applied to the port 128 by the source 130. The valve 144 can then be opened and the valve 146 closed to draw reactive gaseous species from the first chamber 126 without upsetting the steady state condition therein. The downwardly directed carrier gas and the reactive species exit the narrowed bore 176 for diffusion into the work chamber 150. In the case in which the reactive gaseous species contain a semiconductor material such as silicon for incorporation into a chemical vapor deposition process, the reactive gaseous species are free to react within the environment of the work chamber 150 and at the deposition surface to yield a high quality semiconductor film. The process temperature may be as low as approximately 220 degrees Celsius, with no need for a postanneal.

The process and apparatus of the present invention are useful in depositing films of a wide range of semiconductor materials including, for example, silicon, ITO, TO, IO and CTO. In the context of FIG. 3, ITO films may be deposited by evaporating, sputtering or otherwise introducing indium and tin to the deposition environment while reactive species of oxygen are passed from the first flow through chamber 16. The reactive state of the oxygen greatly enhances reaction between the oxygen, indium and tin, yielding a film of high quality ITO on the substrates 30. It is believed that the reactive species of oxygen produced within the chamber 16 initially include $O_2^+$, $O_2^-$, $O^+$, $O^-$, $O_3^+$ and $O_3^-$. When a glow is produced within the chamber 16, the oxygen therein is almost completely ionized. The average lifetimes of the different species can vary between a few nanoseconds and several seconds, permitting the species with greatest lifetimes to reach the work chamber for reaction with the other elements therein. The short lifetimes of some of the species result from recombination either with other ions, with uncharged particles or with electrons.

ITO films produced by the process of the present invention have exhibited optical transmittances of 85% or greater and bulk resistivities in the neighborhood of $2.0 \times 10^{-4}$ ohm-centimeters, as deposited. In films approximately 1000 angstroms thick, sheet resistivity values as low as 16 ohms per square have been obtained. Deposition of ITO having the above characteristics has been accomplished at substrate temperatures as low as 220 degrees Celsius. The partial pressure of oxygen species within the work chamber has been between $6 \times 10^{-5}$ and $2 \times 10^{-4}$ Torr, while the pressure within the first chamber has been between 0.5 Torr and 1.0 Torr. Deposition of a film 700 to 1200 angstroms thick can be accomplished in 1 to 2 minutes.

In addition to the specific compounds discussed above, the process of the present invention is suitable for a wide variety of deposition-related tasks of importance in the semiconductor field. It is useful to deposit any of a wide range of transparent conductive films, many of which are oxides. Oxygen gas is then transformed into its more reactive species while other components of the film are evaporated or sputtered within the work chamber. Films of these oxide materials, and particularly ITO, are useful for surface passivation of semiconductor layers, as the upper contact window in amorphous silicon solar cells, as the upper layer in SIS solar cells, and as antireflection coatings.

The present invention is also useful to dissociate a variety of fluorocarbon gases for use in fluorine and carbon doping processes. Fluorine doping is known to be advantageous in ITO, tin oxide and silicon films, and amorphous silicon films doped with traces of carbon have exhibited superior solar cell characteristics. A partial list of fluorocarbon gases which could be subjected to electrical discharge within the first chambers 16 and 126 of the present invention include $CF_4$, $C_2F_6$, $F_2$, $CCl_3F$, $CCl_2F_2$, $CClF_3$, $CBrF_3$, $CHClF_2$, $CHF_3$, $C_2Cl_3F_3$, $C_2Cl_2F_4$ and $C_2F_6$.

It will be understood that the terms "electrical discharge" and "glow discharge", as used herein, refer generically to ionizing electrical discharges through a gas regardless of whether the applied potential is of the DC, AC, RF, microwave or other type. The term glow discharge thus includes any plasma or other highly ionized state produced within a gas by electrical means. Similarly, the term "highly reactive species" refers to the products of such a discharge, either before or after partial recombination. Such species may be either ionized species or neutral radicals, and possess significantly higher chemical reactivities than the material from which they are produced.

From the above, it can be seen that there has been provided a system for transforming a wide variety of substances into highly reactive species for use in the deposition of a semiconductor film, while maintaining complete flexibility as to the parameters of the deposition process.

What is claimed is:

1. A process for use in the deposition of a semiconductor film, comprising:

producing a stream of reactive gaseous species within a first chamber by exposing a flow of a gaseous material to an electrical discharge, the reactive species containing a semiconductor material;

passing the reactive species to a work environment which is distinct from the first chamber and is maintained at substantially atmospheric pressure; and continuously depositing the semiconductor material from the reactive species onto a substrate passed through the work environment.

2. A process for use in the deposition of a semiconductor film, comprising:

producing a stream of reactive gaseous species within a first chamber by exposing a flow of a gaseous material to an electrical discharge, the reactive species containing a substance to be included within a film;

producing a flow of a gas past an output opening of the first chamber to aspirate the species from the first chamber and carry them to a work environment distinct from and maintained at a higher pressure than the first chamber; and incorporating the substance from the reactive species into a film deposited within the work environment.

* * * * *